US012668876B2

(12) United States Patent
Mustafa et al.

(10) Patent No.: US 12,668,876 B2
(45) Date of Patent: Jun. 30, 2026

(54) PUMP LINER FOR PROCESS CHAMBER

(71) Applicant: Applied Materials, Inc., Santa Clara, CA (US)

(72) Inventors: Muhannad Mustafa, Milpitas, CA (US); Sanjeev Baluja, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 286 days.

(21) Appl. No.: 18/209,026

(22) Filed: Jun. 13, 2023

(65) Prior Publication Data

US 2023/0407473 A1 Dec. 21, 2023

Related U.S. Application Data

(60) Provisional application No. 63/354,090, filed on Jun. 21, 2022.

(51) Int. Cl.
*C23C 16/455* (2006.01)

(52) U.S. Cl.
CPC .............................. *C23C 16/45544* (2013.01)

(58) Field of Classification Search
CPC ............................ C23C 16/4412; C23C 16/52
See application file for complete search history.

(56) References Cited

U.S. PATENT DOCUMENTS

| | | | | | |
|---|---|---|---|---|---|
| 4,230,515 A | * | 10/1980 | Zajac | ................ | H01J 37/32623 |
| | | | | | 156/345.43 |
| 5,846,332 A | * | 12/1998 | Zhao | ........................ | C23C 16/46 |
| | | | | | 118/500 |
| 9,443,753 B2 | | 9/2016 | Palagashvili et al. | | |
| 2020/0032396 A1 | | 1/2020 | Polyak et al. | | |
| 2020/0377998 A1* | | 12/2020 | Mustafa | .............. | C23C 16/4412 |
| 2021/0079524 A1* | | 3/2021 | Yang | .................. | C23C 16/4583 |

FOREIGN PATENT DOCUMENTS

| | | |
|---|---|---|
| CN | 108950519 A | 12/2018 |
| KR | 20060129386 A | 12/2006 |

OTHER PUBLICATIONS

PCT International Search Report and Written Opinion in PCT/US2023/025397 mailed Oct. 13, 2023, 13 pages.

* cited by examiner

*Primary Examiner* — John J Brayton
(74) *Attorney, Agent, or Firm* — SERVILLA WHITNEY LLC

(57) ABSTRACT

Embodiments of the present disclosure are related to directed to a pump liner for a process chamber. The pump liner is aligned with particular components in the process chamber so that there is an upper gap and a lower gap between the pump liner and the particular processing chamber components (e.g., an edge ring). The pump liner advantageously reduces side to side variation in temperature and gas flow based on its alignment with particular components in the process chamber (e.g., the edge ring) and the size of the upper gap and the lower gap. Some embodiments advantageously provide better precursor flow distribution for various process spacing between the showerhead and wafer.

19 Claims, 6 Drawing Sheets

100

104A    104    126    112B    112A

112

103

130

117

116

118

114A

114

106B 106C    106

PUMP LINER FOR PROCESS CHAMBER

CROSS-REFERENCE TO RELATED APPLICATIONS

This application claims priority to U.S. Provisional Application No. 63/354,090, filed Jun. 21, 2022, the entire disclosure of which is hereby incorporated by reference herein.

TECHNICAL FIELD

Embodiments of the present disclosure generally relate to the field of electronic device manufacturing. More particularly, embodiments of the disclosure are directed to a pump liner to reduce side to side variation in temperature and gas flow in a process chamber.

BACKGROUND

Various processing chambers, for example, Atomic Layer Deposition (ALD) and Chemical Vapor Deposition (CVD) chambers use a pump liner to confine the reactive gases to a reaction space adjacent the substrate surface. The pump liners help contain gases within the reaction space and allow rapid evacuation of gases from the reaction space. The pump liners include a plurality of openings to allow the reaction gases to flow through the liner to exhaust. The pump ports are closer to some of the openings than to others. For example, where the pump port is on one side of the ring-shaped liner, the openings in the liner immediately adjacent the pump port are closer than the openings on the opposite side of the liner. To compensate for the different distances, current processing chamber liners have variable size openings to choke the flow of gases toward the pumping ports. The openings closest to the pump port are smaller than the openings further away from the pump port.

Most processing chambers have asymmetric pumping since fore lines are located off-axis with respect to the process chamber. In atomic layer deposition (ALD) process chambers, for example, the edge ring may experience an asymmetric heat loss with respect to the pumping liner, which leads to wafer planar non-uniformity (side to side) of target film thickness. This asymmetric heat loss will be increased further with asymmetric bottom purge due to side-to-side (pumping side vs. slit valve side) flow conductance variation. Some processes are highly sensitive to flow uniformity around the wafer. Therefore, pumping liner hole size optimization is a popular idea to improve flow uniformity around the wafer. Pumping liner hole sizes, e.g., diameter, are commonly optimized to change flow conductance based on simulation or actual wafer deposition mapping. Individualized pumping liner designs are expensive, have large lead times and need trial-and error tests. Even with the individualized approach, achieving pumping liner uniformity remains a goal rather than reality.

Therefore, there is a need in the art for pump liners to reduce side to side variation in temperature and gas flow in process chambers.

SUMMARY

One or more embodiments of the disclosure are directed to a pump liner for a process chamber. The pump liner comprises a ring-shaped body having an upper portion and a lower portion separated by an annular partition having an inner diameter surface defining an inner diameter of the annular partition, an outer diameter surface defining an outer diameter of the annular partition, and a top surface and a bottom surface defining a thickness of the annular partition. The upper portion of the ring-shaped body has an upper peripheral wall and a top wall. The upper peripheral wall has an inner diameter surface defining an inner diameter of the upper peripheral wall and an outer diameter surface defining an outer diameter of the upper peripheral wall. The upper peripheral wall has a plurality of circumferentially spaced apertures extending through a thickness of the upper peripheral wall from an opening in the inner diameter surface to an opening in the outer diameter surface. The top wall has a bottom surface and a top surface defining a thickness of the top wall. An upper channel is formed in the upper portion of the ring-shaped body. The upper channel is defined by the top surface of the annular partition, the outer diameter surface of the upper peripheral wall and the bottom surface of the top wall. The lower portion of the ring-shaped body has a lower peripheral wall and a bottom wall. The lower peripheral wall has an inner diameter surface defining an inner diameter of the lower peripheral wall and an outer diameter surface defining an outer diameter of the lower peripheral wall. The bottom wall has an outer diameter surface defining an outer diameter of the bottom wall, a top surface and a bottom surface defining a thickness of the bottom wall. The inner diameter of the lower peripheral wall is greater than the inner diameter of the upper peripheral wall. A lower channel is formed in the lower portion of the ring-shaped body. The lower channel is defined by the bottom surface of the annular partition, the outer diameter surface of the lower peripheral wall and the top surface of the bottom wall. The lower channel is in fluid communication with the upper channel through at least one passage in the annular partition. A slit valve opening in the lower portion of the ring-shaped body extends from the inner diameter surface of the lower peripheral wall to the outer diameter surface of the lower peripheral wall. The slit valve opening extends a portion of a circumference of the ring-shaped body.

Additional embodiments of the disclosure are directed to a pump liner for a process chamber. The pump liner comprises a ring-shaped body having an upper portion and a lower portion separated by an annular partition having an inner diameter surface defining an inner diameter of the annular partition, an outer diameter surface defining an outer diameter of the annular partition, a top surface and a bottom surface defining a thickness of the annular partition. The inner diameter surface of the upper peripheral wall is concentric with the inner diameter surface of the annular partition. The upper portion of the ring-shaped body has an upper peripheral wall and a top wall. The upper peripheral wall has an inner diameter surface defining an inner diameter of the upper peripheral wall and an outer diameter surface defining an outer diameter of the upper peripheral wall. The upper peripheral wall has in a range of from 4 to 256 circumferentially spaced apertures extending through a thickness of the upper peripheral wall from an opening in the inner diameter surface to an opening in the outer diameter surface. The top wall has a bottom surface and a top surface defining a thickness of the top wall. An upper channel is formed in the upper portion of the ring-shaped body. The upper channel is defined by the top surface of the annular partition, the outer diameter surface of the upper peripheral wall and the bottom surface of the top wall. The lower portion of the ring-shaped body has a lower peripheral wall and a bottom wall. The lower peripheral wall has an inner diameter surface defining an inner diameter of the lower peripheral wall and an outer diameter surface defining an outer diameter of the lower peripheral wall. The bottom wall has an outer diameter surface defining an outer diameter of the bottom wall, a top surface and a bottom surface defining a thickness of the bottom wall. The inner diameter of the lower peripheral wall is greater than the inner diameter of the upper peripheral wall. A lower channel is formed in the lower portion of the ring-shaped body. The lower channel is defined by the bottom surface of the annular partition, the outer diameter surface of the lower peripheral wall and the top surface of the bottom wall. The lower channel is in fluid communication with the upper channel through at least one passage in the annular partition. A portion of the bottom surface of the annular partition is inside the inner diameter of the lower peripheral wall. The at least one passage in the annular partition comprises an arc-shaped segment with a concave surface. A slit valve opening in the lower portion of the ring-shaped body extends from the inner diameter surface of the lower peripheral wall to the outer diameter surface of the lower peripheral wall. The slit valve opening extends in a range of from 100 degrees to 140 degrees of the ring-shaped body.

Further embodiments are directed to a processing chamber. The processing chamber comprises a chamber body having a top wall, a bottom wall and a sidewall containing an interior volume. The chamber body has a slit valve side and a pump port side. The processing chamber further comprises the pump liner described herein. The pump liner is aligned with the slit valve opening aligned with the slit valve side. The processing chamber further comprises an edge ring having an outer diameter surface positioned within the pump liner so that there is an upper gap between an upper portion of the outer diameter surface of the edge ring and the inner diameter surface of the upper peripheral wall and a lower gap between a lower portion of the outer diameter surface of the edge ring and the inner diameter surface of the lower peripheral wall.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
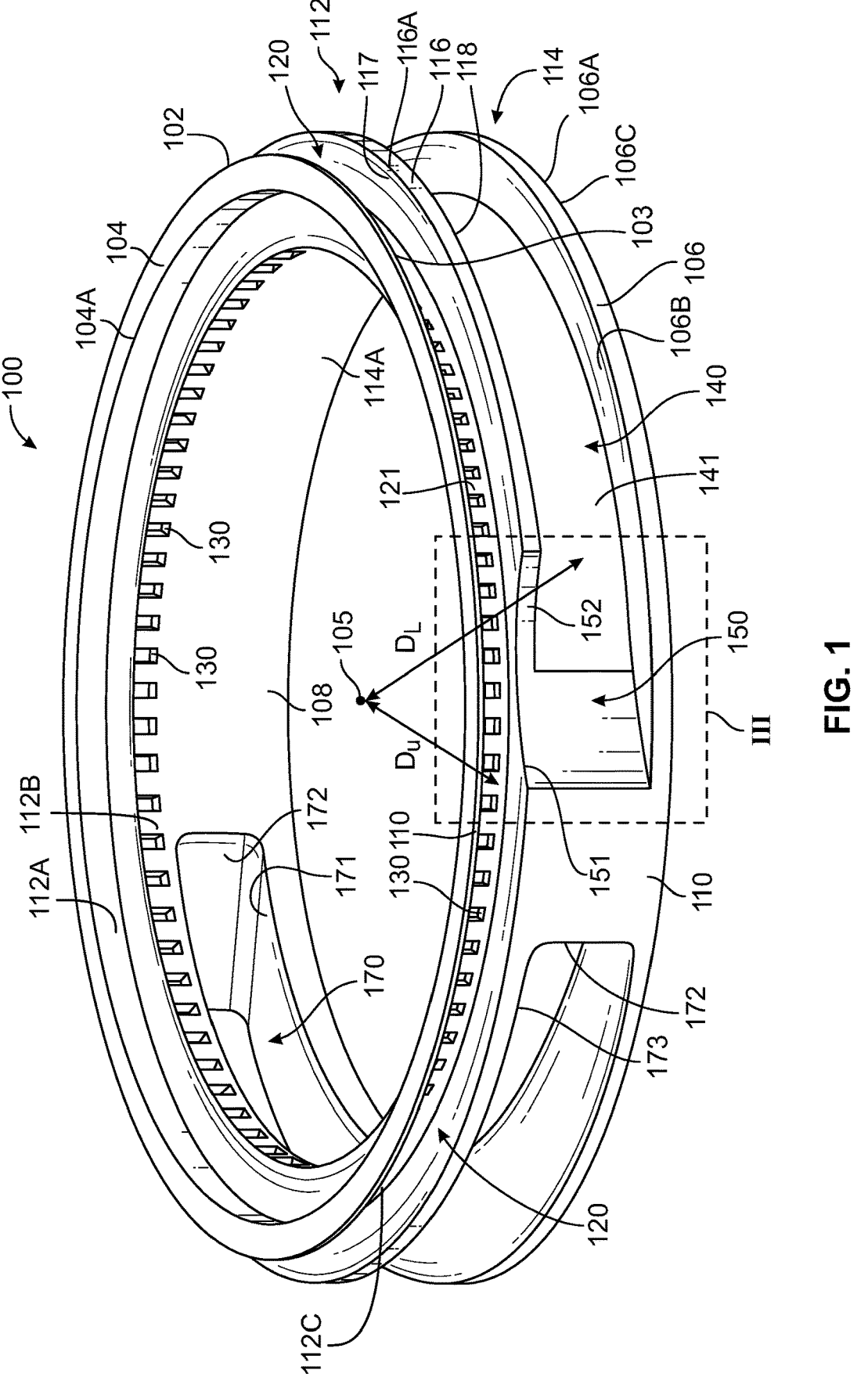
FIG. 1 illustrates an isometric view of a pump liner according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

The term "on" indicates that there is direct contact between elements. The term "directly on" indicates that there is direct contact between elements with no intervening elements.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As used herein, the term "in situ" refers to processes that are all performed in the same processing chamber or within different processing chambers that are connected as part of a processing system, such that each of the processes are performed without an intervening vacuum break. As used herein, the term "ex situ" refers to processes that are performed in at least two different processing chambers such that one or more of the processes are performed with an intervening vacuum break. In some embodiments, one or more of the processes is performed without breaking vacuum or without exposure to ambient air.

As used in this specification and the appended claims, the terms "pump liner" and "pumping liner" may be used interchangeably.

One or more embodiments of the present disclosure provides pump liners that are particularly useful in processing chambers (e.g., ALD processing chambers and CVD processing chambers) and will be described in that context. Other types of processing chambers and applications for the pump liner are also within the scope of the invention.

One or more embodiments of the disclosure are directed to pumping liners with an in-situ self-flow adjusting capability to achieve uniform pumping around wafer regardless of chamber design, fore line location and/or process recipe. Some embodiments advantageously provide better precursor flow distribution for various process spacing between the showerhead and wafer.

One or more embodiments of the disclosure are directed to pumping liners where each of the plurality of circumferentially spaced apertures (i.e., openings) comprise a valve assembly. Each valve assembly comprises a spring-loaded gate, an inner cylinder, and a housing. The valve assembly can be removed and/or replaced during maintenance. At zero pressure drop within the gate, flow conductance is substantially uniform for all valve assemblies.

In some embodiments, the gate is actuated by a spring and self-controlled by pressure differentials. In some embodiments, gate conductance can be varied depending on resultant force between spring force and local fluid pressure. Usually, the pressure at the outlet side of the pump liner is lower than the pressure within the pump liner. Therefore, a pressure difference is generated across each gate which varies by location of the valve assembly. Higher pressure difference will lead to lower gas flow conductance by pushing the gate toward the valve outlet. Since pumping throughput depends on pressure difference as well as flow conductance, the throughput value will be about the same for all valves regardless of location within the pump liner.

In some embodiments, the liner flow conductance is self-adjusting using spring actuation and local pressure difference in each valve assembly. In some embodiments, local flow conductance is adjusted in-situ during processing. In some embodiments, the valve assembly is removable. In some embodiments, the spring force can be altered by the selection of spring and changing free length depending on chamber pressure.

One or more embodiments of the disclosure are directed to pump liners with variable slit valve openings. Some embodiments advantageously provide better precursor flow distribution for various process spacing between the showerhead and wafer. Some embodiments advantageously provide slit type openings which are only varied along the width and have a constant height. Some embodiments advantageously provide a pump liner that does not have flow choking effects at various reaction space sizes.

Current pumping liners with circular openings (apertures) cannot be controlled by changing either horizontal or vertical dimensions of the apertures. Some embodiments of the disclosure advantageously provide pumping liners that, because the heights of the slits in the pumping liner are the same regardless of the pumping port location, flow distribution can be tuned by varying hole widths.

In slit type pumping liners, apertures vary along width based on skewness of flow pressure distribution. The height for all slit apertures typically remains the same. At various process spacing (distance between wafer and showerhead), the liner opening will be the same along vertical direction for all of the openings, unlike circular holes. Slit type liner openings have no flow choking effects at various process spacing. The pumping liner of various embodiments can be used with many types of process chambers where smaller process spacing is used.

Embodiments of the present disclosure advantageously provide pump liners that reduce side to side variation in temperature and gas flow in process chambers. The pump liner is aligned with particular components in the process chamber so that there is an upper gap and a lower gap. The pump liner advantageously reduces side to side variation in temperature and gas flow based on its alignment with particular components in the process chamber and the size of the upper gap and the lower gap. Accordingly, the pump liner advantageously provides substantially symmetric heat loss and substantially symmetric gas flow, compared to current liners. The substantially symmetric heat loss of the pump liner described herein results in reduced planar non-uniformity of film thickness on a wafer. The substantially symmetric gas flow of the pump liner described herein results in substantially symmetric gas purge around a wafer.

As used in this specification and the appended claims, the term "substantially" used in this respect means, as will be understood by those skilled in the art, that there is the possibility that a small portion of gas flow and/or heat loss that is non-symmetric. Stated differently, the term "substantially" used in this respect means that less than or equal to 10%, including less than or equal to 5%, less than or equal to 2.5%, less than or equal to 1%, or less than or equal to 0.1% of quantified gas flow and/or heat loss is non-symmetric.

The embodiments of the disclosure are described by way of the Figures, which illustrate pump liners and processing chambers in accordance with one or more embodiments of the disclosure. The pump liners and processing chambers shown are merely illustrative possible uses for the disclosed apparatuses, and the skilled artisan will recognize that the disclosed apparatuses are not limited to the illustrated applications.

Figure 2:
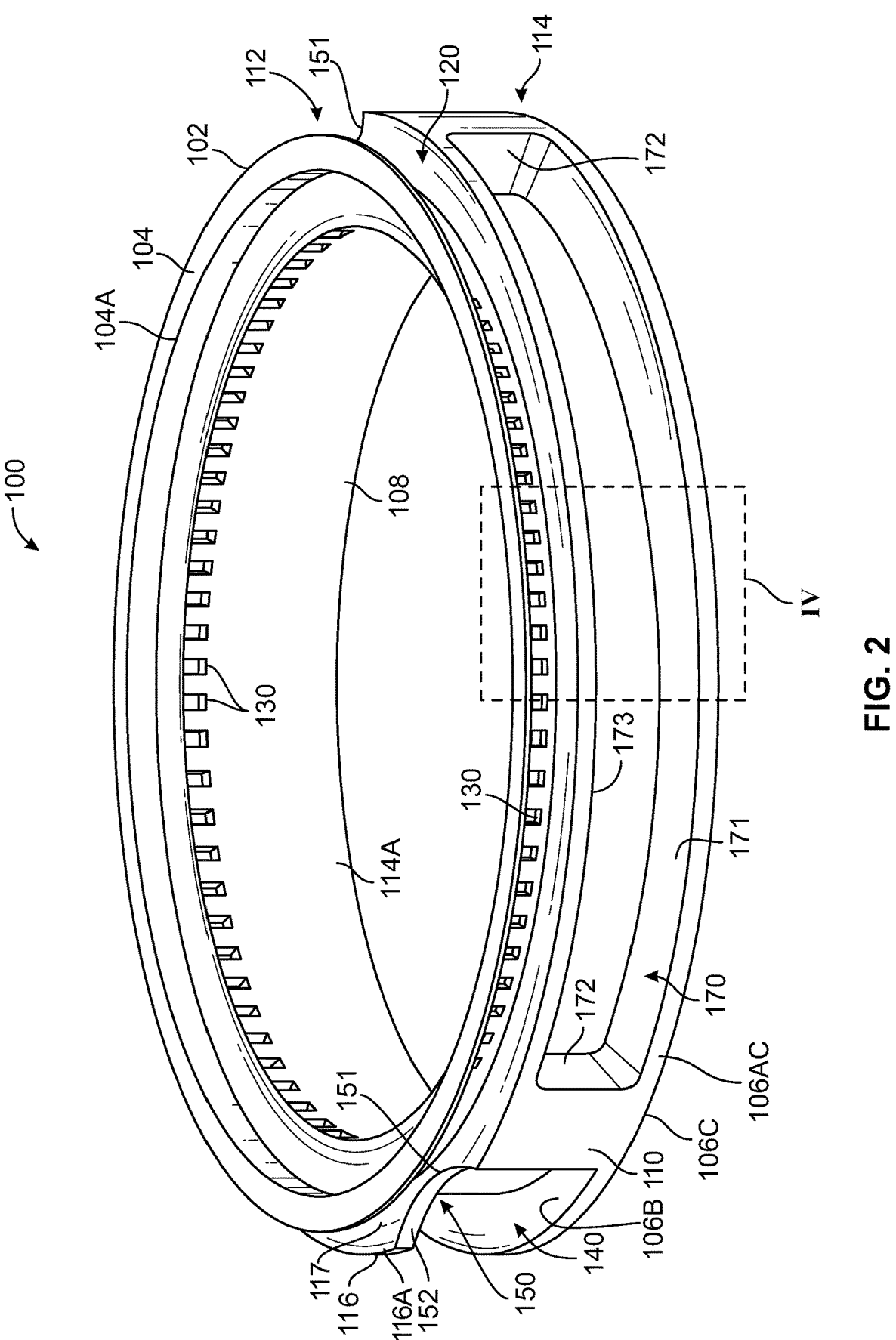
FIG. 2 illustrates the pump liner of FIG. 1 viewed at a different angle.

FIGS. 1 and 2 show isometric views of a pump liner 100 for a process chamber in accordance with one or more embodiments of the disclosure. The pump liner 100 has a ring-shaped body 102. The ring-shaped body 102 has an upper portion 112 and a lower portion 114 separated by an annular partition 116 having an inner diameter surface (not shown) defining an inner diameter of the annular partition 116, an outer diameter surface 116A defining an outer diameter of the annular partition 116, and a top surface 117 and a bottom surface 118 defining a thickness TAP of the annular partition 116.

The upper portion 112 of the ring-shaped body 102 has an upper peripheral wall 112A and a top wall 104. The upper peripheral wall 112A has an inner diameter surface 1128 defining an inner diameter of the upper peripheral wall 112A and an outer diameter surface 112C defining an outer diameter of the upper peripheral wall 112A. In some embodiments, the inner diameter surface 1128 of the upper peripheral wall 112A is concentric with the inner diameter surface of the annular partition 116. The top wall 104 has a bottom surface 103 and a top surface 104A defining a thickness $T_{TW}$ of the top wall 104.

The pump liner has an annular upper channel (e.g., upper channel 120) formed in the upper portion 112 of the ring-shaped body 102. The upper channel 120 of some embodiments extends around the ring-shaped body 102 for 360 degrees. The upper channel 120 shown in the Figures is defined by the top surface 117 of the annular partition 116, the outer diameter surface 112C of the upper peripheral wall 112A and the bottom surface 103 of the top wall 104. The outer diameter surface 121 of the upper channel 120 is recessed a distance from the outer diameter surface 110 of the upper peripheral wall 112A defining a depth of the upper channel 120.

The upper channel 120 has a plurality of circumferentially spaced apertures 130 extending through a thickness of the upper peripheral wall 112A from an opening in the inner diameter surface 1128 to an opening in the outer diameter surface 112C. The plurality of circumferentially spaced apertures 130 provide fluid communication between the upper channel 120 and the inner diameter surface 1128 of the upper peripheral wall 112A.

The lower portion 114 of the ring-shaped body 102 has a lower peripheral wall 114A and a bottom wall 106. The lower peripheral wall 114A has an inner diameter surface 108 defining an inner diameter of the lower peripheral wall 114A and an outer diameter surface 110 defining an outer diameter of the lower peripheral wall 114A. The bottom wall 106 has an outer diameter surface 106A defining an outer diameter of the bottom wall 106, a top surface 106B and a bottom surface 106C defining a thickness $T_{BW}$ of the bottom wall 106. In some embodiments, the inner diameter of the lower peripheral wall 114A (defined by the inner diameter surface 108) is greater than the inner diameter of the upper peripheral wall 112A (defined by the inner diameter surface 112B).

The pump liner 100 has a lower channel 140 formed in the lower portion 114 of the ring-shaped body 102. The lower channel 140 is defined by the bottom surface 118 of the annular partition 116, the outer diameter surface 110 of the lower peripheral wall 114A and the top surface 1068 of the bottom wall 106. The lower channel 140 is in fluid communication with the upper channel 120 through at least one passage 150 in the annular partition 116. In some embodiments, a portion of the bottom surface 118 of the annular partition 116 is inside the inner diameter of the lower peripheral wall 114A (defined by the inner diameter surface 108). In some embodiments, the portion of the bottom surface 118 of the annular partition 116 has a length greater than 10 mm. In some embodiments, the length is greater than or equal to 12 mm, greater than or equal to 15 mm, or greater than or equal to 20 mm.

The plurality of circumferentially spaced apertures 130 allows a flow of gas to pass from within the ring-shaped body 102 to the upper channel 120. In some embodiments, each of the plurality of circumferentially spaced apertures 130 has an independent height H. In some embodiments, each of the plurality of circumferentially spaced apertures 130 has the same height H (see FIGS. 3 and 4). In some embodiments, each of the circumferentially spaced apertures 130 has an independent width W (also illustrated in FIGS. 3 and 4).

The sizes of the circumferentially spaced apertures 130 can be varied to change the conductance of gases through the circumferentially spaced apertures 130 at various angular positions. For example, the circumferentially spaced apertures 130 adjacent the passage 150 can be smaller than the apertures further away from the passage 150.

The circumferentially spaced apertures 130 of some embodiments are rectangular in shape. As used in this manner, the term "rectangular" means a quadrilateral with two sets of parallel sides so that each set of parallel sides are perpendicular to the other set of parallel sides. A rectangular shape according to one or more embodiment has rounded corners or corners having an intersection angle of 90 degrees, or in a range of from 85-95 degrees, including 87-93 degrees, 88-92 degrees, or 89-91 degrees.

Figure 4:
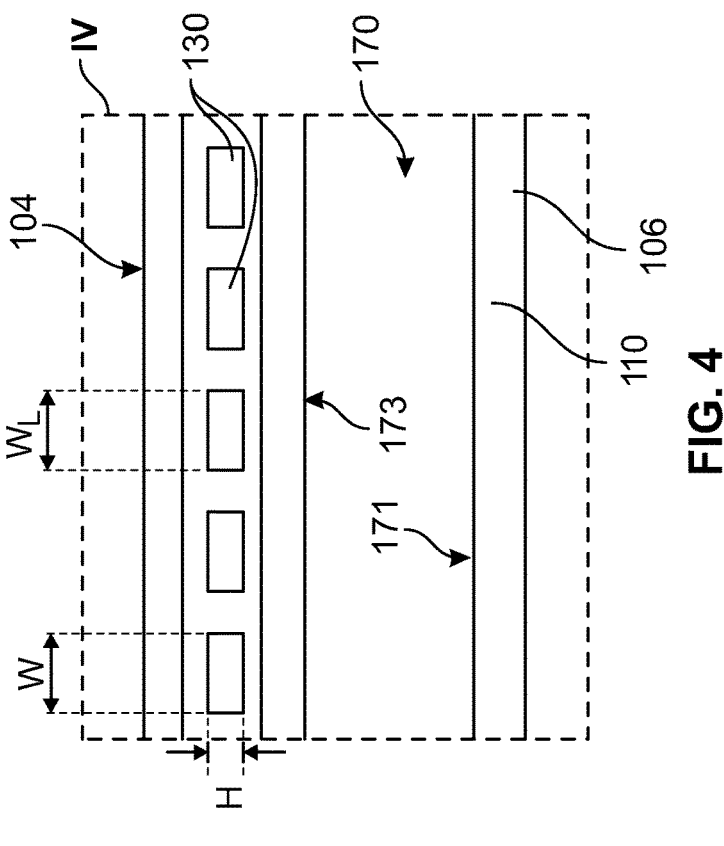
FIG. 4 illustrates an expanded view of Region IV from FIG. 2.
Figure 3:
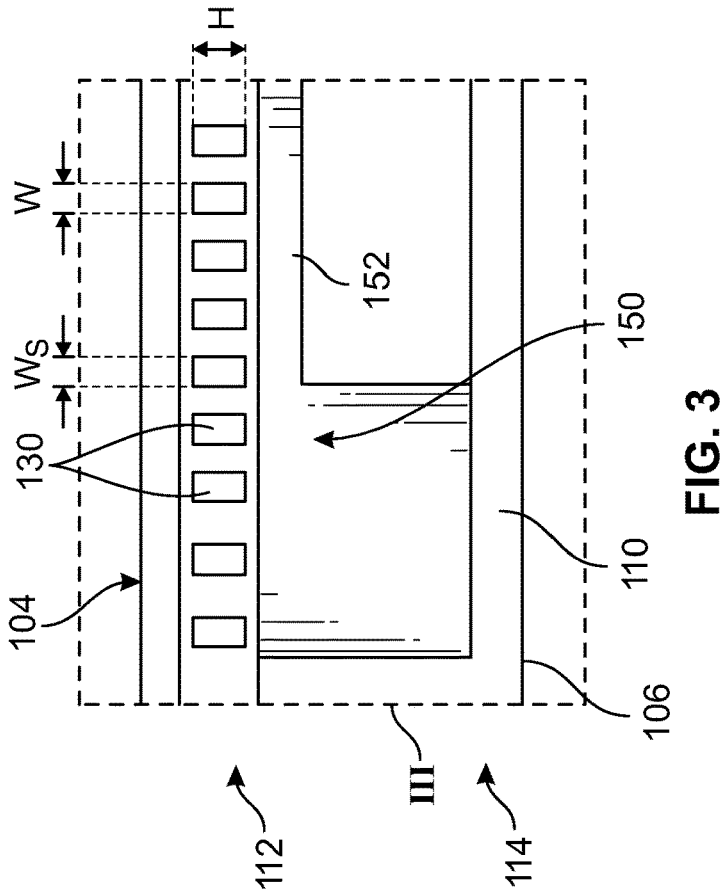
FIG. 3 illustrates an expanded view of Region III from FIG. 1.

Referring to FIGS. 3 and 4, according to some embodiments, the width W of the circumferentially spaced apertures 130 varies between a largest width $W_L$ and a smallest width $W_S$. In some embodiments, the smallest width WS is adjacent the at least one passage 150 in the annular partition 116. The height H of the circumferentially spaced apertures 130 are substantially the same, meaning that the height of any aperture 130 is within 5%, 2%, 1%, or 0.5% of the average height of the plurality of circumferentially spaced apertures 130. In some embodiments, the height H of the apertures 130 is in a range of from 0.1 inch to 0.8 inches, or in the range of 0.2 inches to 0.6 inches, or in the range of 0.25 inches to 0.55 inches.

The number of circumferentially spaced apertures 130 can be varied to allow control of gas conductance. In some embodiments, there are in a range of from 4 to 256 apertures, including all ranges and sub values therebetween. In some embodiments, there are in the range of 36 to 144 apertures. In some embodiments, there are greater than or equal to 4, 8, 16, 24, 30, 36, 48, 60, 72, 84, 90, 120, 150 or 180 apertures.

The apertures 130 of some embodiments are arranged in groups of different sizes. For example, a group of apertures adjacent the at least one passage 150 can have the same smallest width $W_S$, and a group of apertures centered 90 degrees from the at least one passage 150 can have the same largest width $W_L$. In some embodiments, there are in the range of 2 to 24 different size apertures, or in the range of 3 to 18 apertures, or in the range of 4 to 12 apertures, or in the range of 6 to 10 apertures.

The pump liner 100 includes a slit valve opening 170 in the lower portion 114 of the ring-shaped body 102 extending a portion of a circumference of the ring-shaped body 102 (e.g., from the inner diameter surface 108 of the lower peripheral wall 114A to the outer diameter surface 110 of the lower peripheral wall 114A). The slit valve opening 170 has a bottom face 171, sides 172 and a top face 173. The sides 172 are also referred to as a first side and a second side.

In some embodiments, the slit valve opening 170 has a width sufficient to permit a semiconductor wafer to be transferred therethrough. For example, if the semiconductor wafers being processed have a diameter of 300 mm, the width of the slit valve opening 170 is at least 300 mm between the closest points. In some embodiments, the slit valve opening 170 has a height sufficient to allow a robot end effector supporting a semiconductor wafer to be transferred therethrough.

In some embodiments, the slit valve opening 170 in the outer diameter surface 110 extends in the range of 80 degrees to 180 degrees, or in the range of 90 degrees to 160 degrees, or in the range of from 100 degrees to 140 degrees of the ring-shaped body 102. In some embodiments, the lower channel 140 extends around the outer diameter surface 110 in the range of 150 degrees to 250 degrees, or in the range of 200 degrees to 225 degrees.

The pump liner 100 includes a lower channel 140 in the lower portion 114 of the outer diameter surface 110. The lower channel 140 is separated from the upper channel 120 by the annular partition 116. The height of the lower channel 140 is defined by the distance between the bottom surface 118 of the annular partition 116 and the top surface 106B of the bottom wall 106 of the ring-shaped body 102. The outer peripheral face (outer wall 141) of the lower channel 140 is recessed a distance from the outer diameter surface 110 defining a depth of the lower channel 140.

In the illustrated embodiment, the outer diameter surface 121 of the upper channel 120 has a radial distance Du from a center 105 of the ring-shaped body 102 that is smaller than a radial distance DL of the outer wall 141 of the lower channel 140. Stated differently, in some embodiments, the depth of the upper channel 120 is greater than the depth of the lower channel 140. The skilled artisan will recognize that the center 105 marked on the Figures is not an actual physical point but a radial center of the ring-shaped body 102.

In some embodiments, the outer diameter surface 121 of the upper channel 120 has a radial distance Du from the center 105 of the ring-shaped body 102 that is equal to or greater than the radial distance DL of the outer wall 141 of the lower channel 140. Stated differently, in some embodiments, the depth of the upper channel 120 is equal to or less than the depth of the lower channel 140.

The lower channel 140 is in fluid communication with the upper channel 120 through at least one passage 150 in the annular partition 116. The at least one passage 150 can be any suitable shape and size to allow sufficient conduction of gases through the passage 150. In some embodiments, the at least one passage 150 in the annular partition 116 is an arc-shaped segment 151 with a concave surface 152 facing the outer diameter surface 110.

Figure 5:
FIG. 5 illustrates an exploded view of a portion of the pump liner according to one or more embodiments of the disclosure.

FIG. 5 illustrates an exploded view of a portion the pump liner 100. In the illustrated embodiment of FIG. 5, the annular partition 116 extends a length farther than the length of the lower portion 114. The length of the annular partition 116 creates an upper gap between the upper portion 112 and a surface positioned within a distance of the outer diameter surface 112C of the upper portion 112 of the ring-shaped body 102. The length of the lower portion 114 creates a lower gap between the lower portion 114 and a surface positioned within a distance of the outer diameter surface 110 of the lower portion 114 of the ring-shaped body 102. The pump liner 100 described herein advantageously reduces side to side temperature of a surface positioned within 25 mm of the outer diameter surface (e.g., 110 and 112C) of the ring-shaped body 102. In some embodiments, the pump liner 100 reduces side to side temperature of a surface positioned within 20 mm, within 15 mm, within 10 mm, within 5 mm, within 2 mm, or within 1 mm of the outer diameter surface (e.g., 110 and 112C) of the ring-shaped body 102.

Figure 6:
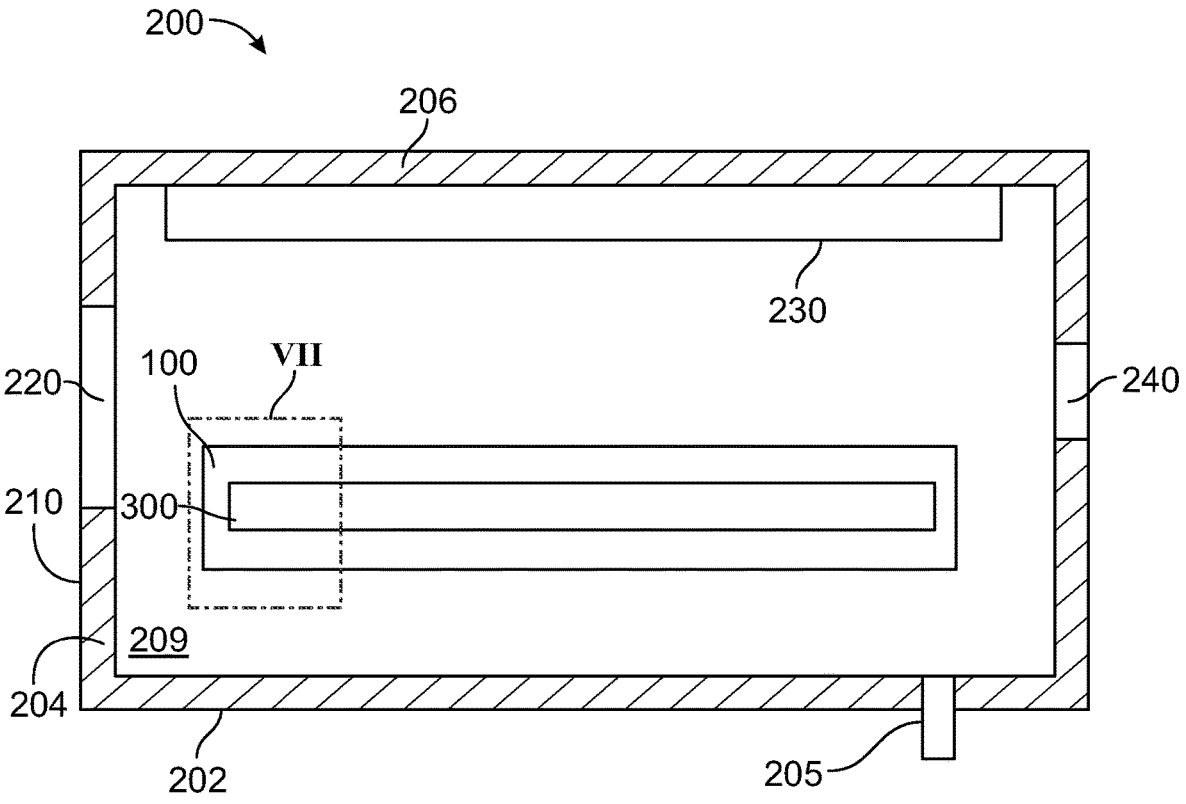
FIG. 6 illustrates a schematic cross-sectional view of a processing chamber including the pump liner according to one or more embodiment of the disclosure.

Referring to FIG. 6, one or more embodiments of the disclosure are directed to processing chambers 200 comprising a pump liner 100 as described herein.

The processing chamber 200 has a chamber body 210 having a top wall 206 (i.e., a process chamber lid), a bottom wall 202 and at least one sidewall 204. The chamber body 210 along with the top wall 206 define an interior volume 209. The processing chamber 200 has a gas injector 230 (also referred to as a gas distribution plate or a showerhead). The type of gas injector 230 used will depend on, for example, the type of process being performed and the type of showerhead or gas injector. For example, a processing chamber 200 configured to operate as an atomic layer deposition apparatus may have a showerhead or vortex type gas injector. A processing chamber 200 configured to operate as a plasma station may have one or more electrode and/or grounded plate configuration to generate a plasma while allowing a plasma gas to flow toward the substrate.

The chamber body 210 has a slit valve side 220 and a pump port side 240. In the illustrated embodiment of FIG. 6, the slit valve is on the left side and the pump port is on the right side. The skilled artisan will recognize that the particular arrangement of the slit valve and the pump port is merely exemplary and should not be taken as limiting the scope of the disclosure. As used herein, the term "slit valve" refers to an area that may be opened or closed, the area configured to allow for insertion and removal of a substrate.

The processing chamber 200 typically includes a vacuum source (not shown) connected to an exhaust port 205 for maintaining a reduced pressure state within the interior volume 209. An edge ring 300 and the pump liner 100 are within the processing chamber 200. A space between the edge ring 300 and the gas injector 230 is referred to as the process region 225. In some embodiments, a pump port is positioned adjacent the process region 225 to evacuate gases from the process region 225. In some embodiments, the pump port is connected to a vacuum source (not shown) for evacuation purposes. The vacuum source connected to the pump port can be the same source or different source than that connected to the exhaust port 205.

The pump liner 100 is aligned with the slit valve opening 170 aligned with the slit valve side 220. The pump liner 100 comprises one or more alignment pins (not shown) configured to secure alignment with the slit valve side 220. In some embodiments, the pump liner 100 has in a range of from 1 alignment pin to 6 alignment pins, including all ranges and sub values therebetween. In some embodiments, the pump liner 100 has 3 alignment pins.

Figure 7:
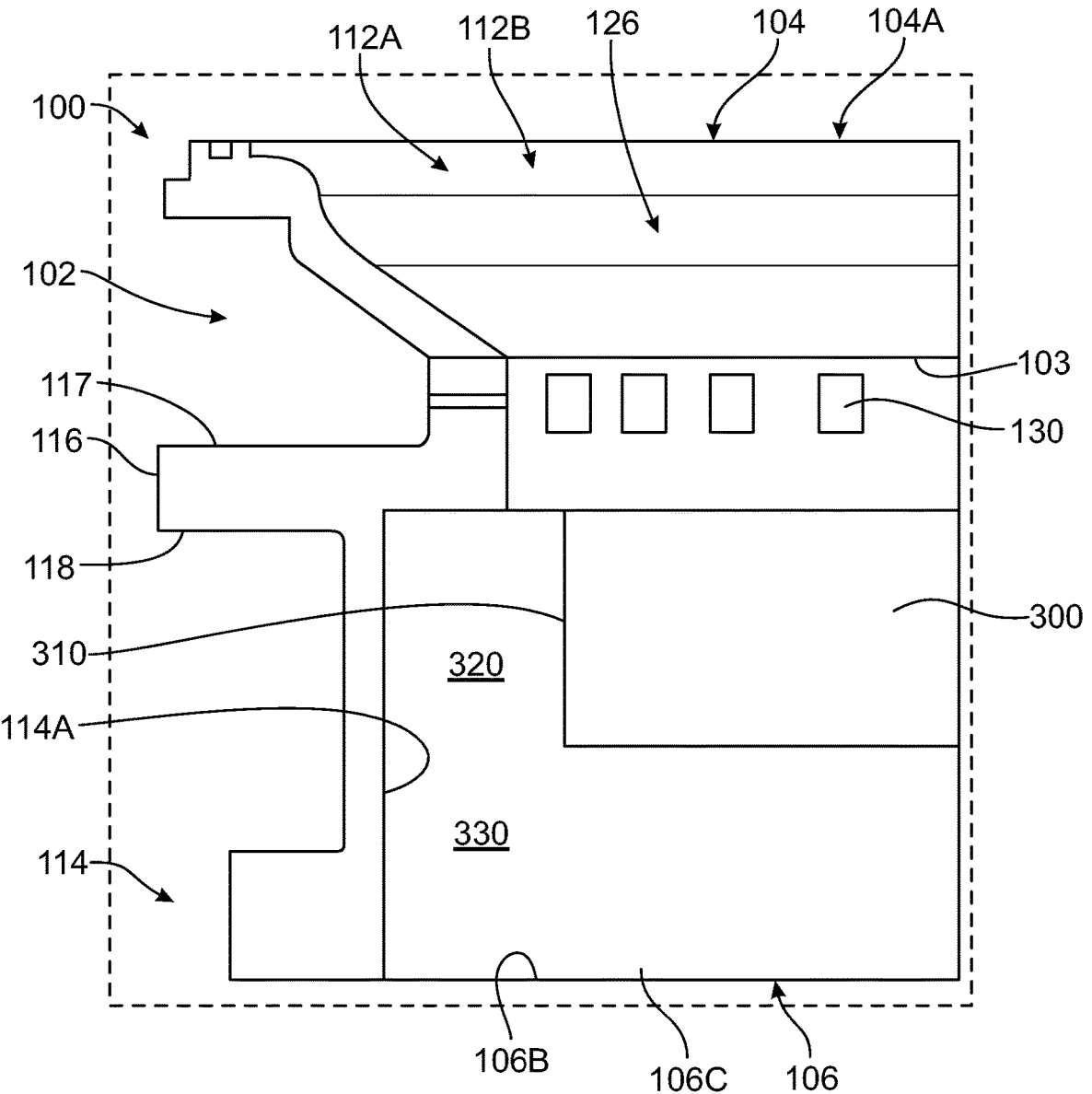
FIG. 7 illustrates an expanded view of Region VII of FIG. 6.

FIG. 7 illustrates an expanded view of Region VII of FIG. 6 showing the relationship between the pump liner 100 and the edge ring 300 in the processing chamber 200. In the illustrated embodiment of FIG. 7, the pump liner 100 and the edge ring 300 are interpreted as being on the slit valve side 220 on the left side of the processing chamber 200. The skilled artisan will recognize that the particular arrangement of the slit valve and the pump port is merely exemplary and should not be taken as limiting the scope of the disclosure. In some embodiments, the pump liner 100 and the edge ring 300 may be on the pump port side 240 on the left side of the processing chamber 200.

The edge ring 300 has an outer diameter surface 310 positioned within the pump liner 100 so that there is an upper gap 320 between an upper portion of the outer diameter surface 310 of the edge ring 300 and the inner diameter surface 112B of the upper peripheral wall 112A and a lower gap 330 between a lower portion of the outer diameter surface 310 of the edge ring 300 and the inner diameter surface 108 of the lower peripheral wall 114A.

The pump liner 100 advantageously reduces side to side variation in gas flow when the upper gap 320 and the lower gap 330 between the upper portion 112 and the lower portion 114 of the outer diameter surface 310 of the edge ring 300 and the inner diameter surface 108, 112B of the pump liner 100 is greater on the slit valve side 220 (which is aligned with the slit valve opening 170) than the pump port side 240 (which is aligned with the pump port). In some embodiments, the upper gap 320 is in a range of from 0.1 inches to 0.5 inches, including all ranges and sub values therebetween. In some embodiments, the lower gap 330 is in a range of from 0.5 inches to 1.0 inch, including all ranges and sub values therebetween.

In some embodiments, the pump liner 100 advantageously provides substantially symmetric heat loss and substantially symmetric gas flow, based on its alignment with particular components (i.e., the edge ring 300 and the slit valve side) in the process chamber 200 and the size of the upper gap 320 and the lower gap 330, compared to current liners. The substantially symmetric heat loss of the pump liner 100 described herein results in reduced planar non-uniformity of film thickness on a wafer. The substantially symmetric gas flow of the pump liner 100 described herein results in substantially symmetric gas purge around a wafer.

In embodiments where the upper gap 320 and the lower gap 330 between the upper portion 112 and the lower portion 114 of the outer diameter surface 310 of the edge ring 300 and the inner diameter surface 108, 1128 of the pump liner 100 is greater on the slit valve side 220 (which is aligned with the slit valve opening 170) than the pump port side 240 (which is aligned with the pump port), the total amount of heat loss is at least 50% and, in some embodiments, about 55%, or about 60%, more symmetric than heat loss in conventional pump liners.

The pump liner may be used in one processing chamber, or one or more pump liners may be used in one or more separate processing chambers. The pump liner may be transferred from one processing chamber to a second, separate processing chamber. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, a suitable processing apparatus may comprise multiple processing chambers (and multiple pump liners) in communication with a transfer station. An apparatus of this sort may be referred to as a multi-chamber processing system.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A pump liner comprising:
a ring-shaped body having an upper portion and a lower portion separated by an annular partition,
the upper portion of the ring-shaped body having an upper peripheral wall and a top wall, the upper peripheral wall having an inner diameter surface and an outer diameter surface, the upper peripheral wall having a plurality of circumferentially spaced apertures extending through a thickness of the upper peripheral wall from an opening in the inner diameter surface to an opening in the outer diameter surface;
an upper channel formed in the upper portion of the ring-shaped body, the upper channel defined by a top surface of the annular partition, the outer diameter surface of the upper peripheral wall, and a bottom surface of the top wall,
the lower portion of the ring-shaped body having a lower peripheral wall and a bottom wall, the lower peripheral wall having an inner diameter surface and an outer diameter surface;
a lower channel formed in the lower portion of the ring-shaped body, the lower channel in fluid communication with the upper channel through at least one passage in the annular partition; and a slit valve opening in the lower portion of the ring-shaped body extending from the inner diameter surface of the lower peripheral wall to the outer diameter surface of the lower peripheral wall, the slit valve opening extending a portion of a circumference of the ring-shaped body and, wherein the pump liner is configured for use in a processing chamber including:

a chamber body having a slit valve side and a pump port side; and an edge ring having an outer diameter surface positioned within the pump liner so that there is an upper gap between an upper portion of the outer diameter surface of the edge ring and the inner diameter surface of the upper peripheral wall and a lower gap between a lower portion of the outer diameter surface of the edge ring and the inner diameter surface of the lower peripheral wall, wherein the pump liner is configured to be aligned with the slit valve opening aligned with the slit valve side, and the pump liner reduces side to side variation in gas flow when the upper gap and the lower gap between the upper portion and the lower portion of the outer diameter surface of the edge ring and the inner diameter surface of the pump liner is greater on the slit valve side than the pump port side.

2. The pump liner of claim 1, wherein the annular partition has an inner diameter surface, an outer diameter surface, the top surface, and a bottom surface, and the inner diameter surface of the upper peripheral wall is concentric with the inner diameter surface of the annular partition.

3. The pump liner of claim 2, wherein a portion of the bottom surface of the annular partition is inside an inner diameter of the lower peripheral wall, the inner diameter defined by the inner diameter surface of the lower peripheral wall.

4. The pump liner of claim 3, wherein the portion of the bottom surface of the annular partition has a length greater than 10 mm.

5. The pump liner of claim 1, wherein the plurality of circumferentially spaced apertures allows a flow of gas to pass from within the ring-shaped body to the upper channel and each of the plurality of circumferentially spaced apertures has an independent height and independent width.

6. The pump liner of claim 3, wherein the top wall of the upper portion of the ring-shaped body has a bottom surface and a top surface defining a thickness of the top wall, the bottom wall has an outer diameter surface, a top surface, and a bottom surface, the inner diameter of the lower peripheral wall being greater than an inner diameter of the upper peripheral wall, the inner diameter of the upper peripheral wall defined by the inner diameter surface of the upper peripheral wall, and the lower channel is defined by the bottom surface of the annular partition, the outer diameter surface of the lower peripheral wall and the top surface of the bottom wall.

7. The pump liner of claim 1, wherein the slit valve opening has a height and width sufficient to permit a semiconductor wafer and a robot end effector supporting the semiconductor wafer to be transferred therethrough.

8. The pump liner of claim 7, wherein the slit valve opening in the lower portion of the ring-shaped body extends in a range of from 100 degrees to 140 degrees of the ring-shaped body.

9. The pump liner of claim 1, wherein there are in a range of from 4 to 256 circumferentially spaced apertures.

10. The pump liner of claim 1, wherein the pump liner reduces side to side variation in temperature of a surface positioned within 10 mm of the outer diameter surface of the ring-shaped body.

11. The pump liner of claim 10, wherein each of the plurality of circumferentially spaced apertures have a width ranging between a largest width and a smallest width, the smallest width adjacent the at least one passage in the annular partition.

12. The pump liner of claim 1, wherein each of the plurality of circumferentially spaced apertures is in a range of from 0.1 inch to 0.8 inches.

13. The pump liner of claim 1, wherein the at least one passage in the annular partition is an arc-shaped segment with a concave surface.

14. A processing chamber comprising:

a chamber body having a top wall, a bottom wall and a sidewall containing an interior volume, the chamber body having a slit valve side and a pump port side;

a pump liner comprising:

a ring-shaped body having an upper portion and a lower portion separated by an annular partition, the upper portion of the ring-shaped body having an upper peripheral wall and a top wall, the upper peripheral wall having an inner diameter surface and an outer diameter surface, the upper peripheral wall having a plurality of circumferentially spaced apertures extending through a thickness of the upper peripheral wall from an opening in the inner diameter surface to an opening in the outer diameter surface;

an upper channel formed in the upper portion of the ring-shaped body, the upper channel defined by a top surface of the annular partition, the outer diameter surface of the upper peripheral wall, and a bottom surface of the top wall, the lower portion of the ring-shaped body having a lower peripheral wall and a bottom wall, the lower peripheral wall having an inner diameter surface;

a lower channel formed in the lower portion of the ring-shaped body, the lower channel in fluid communication with the upper channel through at least one passage in the annular partition; and a slit valve opening in the lower portion of the ring-shaped body extending from the inner diameter surface of the lower peripheral wall to the outer diameter surface of the lower peripheral wall, the slit valve opening extending a portion of a circumference of the ring-shaped body, the pump liner aligned with the slit valve opening aligned with the slit valve side; and an edge ring having an outer diameter surface positioned within the pump liner so that there is an upper gap between an upper portion of the outer diameter surface of the edge ring and the inner diameter surface of the upper peripheral wall and a lower gap between a lower portion of the outer diameter surface of the edge ring and the inner diameter surface of the lower peripheral wall, wherein the pump liner reduces side to side variation in gas flow when the upper gap and the lower gap between the upper portion and the lower portion of the outer diameter surface of the edge ring and the inner diameter surface of the pump liner is greater on the slit valve side than the pump port side.

15. The processing chamber of claim 14, wherein the upper gap is in a range of from 0.1 inches to 0.5 inches.

16. The processing chamber of claim 14, wherein the lower gap is in a range of from 0.5 inches to 1.0 inch.

17. A pump liner comprising:

a ring-shaped body having an upper portion and a lower portion separated by an annular partition having an inner diameter surface annular partition, an outer diameter surface, a top surface, and a bottom surface the upper portion of the ring-shaped body having an upper peripheral wall and a top wall, the upper peripheral wall having an inner diameter surface and an outer diameter surface, the inner diameter surface of the upper peripheral wall concentric with the inner diameter surface of the annular partition, the upper peripheral wall having in a range of from 4 to 256 circumferentially spaced apertures extending through a thickness of the upper peripheral wall from an opening in the inner diameter surface to an opening in the outer diameter surface;

an upper channel formed in the upper portion of the ring-shaped body, the upper channel defined by the top surface of the annular partition, the outer diameter surface of the upper peripheral wall, and a bottom surface of the top wall;

the lower portion of the ring-shaped body having a lower peripheral wall and a bottom wall, the lower peripheral wall having an inner diameter surface defining an inner diameter of the lower peripheral wall and an outer diameter surface;

a lower channel formed in the lower portion of the ring-shaped body, the lower channel in fluid communication with the upper channel through at least one passage in the annular partition, a portion of the bottom surface of the annular partition inside the inner diameter of the lower peripheral wall, the at least one passage comprising an arc-shaped segment with a concave surface; and a slit valve opening in the lower portion of the ring-shaped body extending from the inner diameter surface of the lower peripheral wall to the outer diameter surface of the lower peripheral wall, the slit valve opening extending in a range of from 100 degrees to 140 degrees of the ring-shaped body, wherein the pump liner is configured for use in a processing chamber including:

a chamber body having a slit valve side and a pump port side; and an edge ring having an outer diameter surface positioned within the pump liner so that there is an upper gap between an upper portion of the outer diameter surface of the edge ring and the inner diameter surface of the upper peripheral wall and a lower gap between a lower portion of the outer diameter surface of the edge ring and the inner diameter surface of the lower peripheral wall, wherein the pump liner is configured to be aligned with the slit valve opening aligned with the slit valve side, and the pump liner reduces side to side variation in gas flow when the upper gap and the lower gap between the upper portion and the lower portion of the outer diameter surface of the edge ring and the inner diameter surface of the pump liner is greater on the slit valve side than the pump port side.

18. The pump liner of claim 17, wherein the slit valve opening has a height and width sufficient to permit a semiconductor wafer and a robot end effector supporting the semiconductor wafer to be transferred therethrough.

19. The pump liner of claim 17, wherein the pump liner reduces side to side variation in temperature of a surface positioned within 10 mm of the outer diameter surface of the ring-shaped body.

* * * * *